(12) United States Patent
Prabhakar et al.

(10) Patent No.: US 12,207,439 B2
(45) Date of Patent: Jan. 21, 2025

(54) COMPUTER COOLING DEVICE ACTIVITY INDICATION

(71) Applicant: Microsoft Technology Licensing, LLC, Redmond, WA (US)

(72) Inventors: Sandeep Prabhakar, Bellevue, WA (US); Tristan Anthony Brown, Houston, TX (US); Rajagopal K Venkatachalam, Sammamish, WA (US); Thomas Arthur Sewell, Mill Creek, WA (US); Cho Yu Chong, Bothell, WA (US); Brendan W Flynn, Snoqualmie, WA (US); Mark Allan Bellon, Seattle, WA (US); Gregory Allen Nielsen, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 332 days.

(21) Appl. No.: 17/445,689

(22) Filed: Aug. 23, 2021

(65) Prior Publication Data
US 2023/0057741 A1    Feb. 23, 2023

(51) Int. Cl.
*H05K 7/20* (2006.01)
*G05D 23/19* (2006.01)
*G06F 1/20* (2006.01)

(52) U.S. Cl.
CPC ..... *H05K 7/20209* (2013.01); *G05D 23/1931* (2013.01); *G06F 1/203* (2013.01); *G06F 1/206* (2013.01); *H05K 7/20136* (2013.01)

(58) Field of Classification Search
CPC ........... H05K 7/20209; H05K 7/20136; G05D 23/1931; G06F 1/203; G06F 1/206; G06F 1/3287
See application file for complete search history.

(56) References Cited

U.S. PATENT DOCUMENTS

| 6,092,021 | A | 7/2000 | Ehlbeck et al. |
| 6,194,858 | B1 * | 2/2001 | Chen ................. H05K 7/20209 388/903 |
| 6,988,048 | B2 | 1/2006 | Lin |
| 7,894,191 | B2 | 2/2011 | Tsuchiya |
| 8,239,860 | B2 | 8/2012 | Locker et al. |

(Continued)

FOREIGN PATENT DOCUMENTS

CN    100444116 C    12/2008
JP    2011155206 A    8/2011

OTHER PUBLICATIONS

"Desktop 3rd Generation Intel™ Core™ Processor Family, Desktop Intel® Pentium® Processor Family, Desktop Intel® Celeron® Processor Family, and LGA1155 Socket", In Datasheet, vol. 1 of 2, Jan. 2013, 132 Pages.

(Continued)

*Primary Examiner* — Zhipeng Wang
(74) *Attorney, Agent, or Firm* — Alleman Hall & Tuttle LLP

(57) ABSTRACT

A computing device includes a cooling device and a cooling activity monitor configured to assess a cooling activity of the cooling device. A cooling activity reporter is configured to, based at least in part on the cooling activity of the cooling device crossing a predefined cooling activity threshold, communicate a cooling activity indication to a resource manager of the computing device.

18 Claims, 8 Drawing Sheets

(56) References Cited

U.S. PATENT DOCUMENTS

| | | | |
|---|---|---|---|
| 9,268,389 B2 | 2/2016 | Hanappe | |
| 9,552,804 B2 | 1/2017 | Costa et al. | |
| 10,083,683 B2 | 9/2018 | Huo et al. | |
| 10,203,746 B2 | 2/2019 | Kumar | |
| 10,514,736 B2 | 12/2019 | Wu | |
| 11,218,824 B1 * | 1/2022 | Huo | H04R 1/1083 |
| 11,853,129 B1 * | 12/2023 | Hooshmand | G06F 1/1681 |
| 2003/0115242 A1 | 6/2003 | Hayduk | |
| 2011/0133944 A1 * | 6/2011 | Homer | G06F 1/206 |
| | | | 340/635 |
| 2013/0101389 A1 * | 4/2013 | Chou | F04D 27/004 |
| | | | 415/60 |
| 2013/0130610 A1 * | 5/2013 | Unno | G06F 1/20 |
| | | | 454/184 |
| 2014/0117908 A1 * | 5/2014 | Busch | H02P 1/04 |
| | | | 318/471 |
| 2019/0008074 A1 * | 1/2019 | Chen | G05D 23/1917 |
| 2019/0121409 A1 * | 4/2019 | Wu | G06F 21/35 |
| 2021/0068302 A1 | 3/2021 | North et al. | |
| 2021/0181817 A1 * | 6/2021 | Lu | G06F 1/20 |

OTHER PUBLICATIONS

"Reducing Noise on HP Desktops", Retrieved from: https://www8.hp.com/h20195/v2/GetPDF.aspx/4AA7-8395ENW.pdf, Dec. 2020, 6 Pages.

Otto, Eugene, "Temperature-Aware Operating System Scheduling", In Thesis of STS 402, Mar. 31, 2006, 29 Pages.

* cited by examiner

| FAN ACTIVITY | NOISE LEVEL |
|---|---|
| 1-5000 RPM | LOW |
| 5000-6500 RPM | MED |
| 6500+ RPM | HIGH |

FIG. 5

COMPUTER COOLING DEVICE ACTIVITY INDICATION

BACKGROUND

Computing devices often generate heat during operation. To prevent overheating, computing devices often include one or more cooling devices (e.g., cooling fans) configured to regulate temperature within a housing of the computing device and cool components of the device (e.g., by controlling airflow within the device housing).

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

A computing device includes a cooling device and a cooling activity monitor configured to assess a cooling activity of the cooling device. A cooling activity reporter is configured to, based at least in part on the cooling activity of the cooling device crossing a predefined cooling activity threshold, communicate a cooling activity indication to a resource manager of the computing device.

BRIEF DESCRIPTION OF THE DRAWINGS

FIG. 5 shows an example activity-to-noise map correlating different cooling activity values of a cooling device with a plurality of different cooling device noise levels.

DETAILED DESCRIPTION

Figure 1:
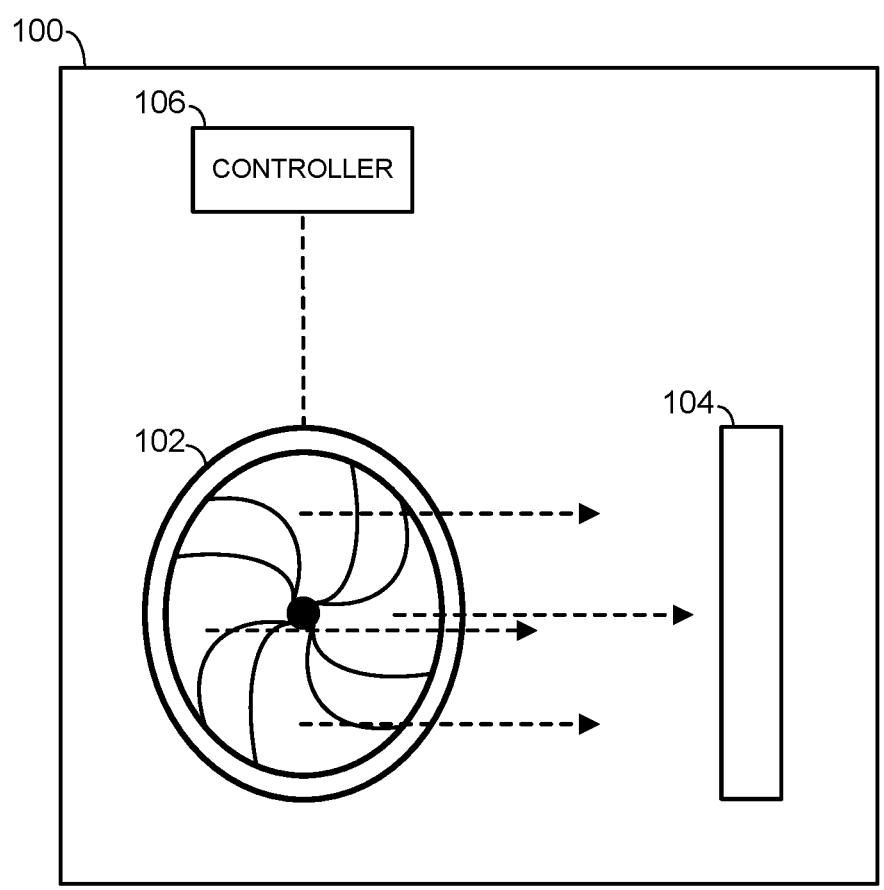
FIG. 1 schematically shows an example cooling device within a computing device.

FIG. 1 schematically shows an example computing device 100 including a cooling device 102 and a computer hardware component 104. In this example, the cooling device takes the form of a cooling fan. Rotation of fan blades of cooling device 102 causes airflow in the direction of hardware component 104 (indicated in FIG. 1 by the dashed arrows extending away from the cooling device), which may contribute to cooling the hardware component—e.g., by replacing relatively hot air surrounding the hardware component with relatively cooler air from a surrounding environment. Hardware component 104 may include, as non-limiting examples, a central processing unit (CPU), graphics processing unit (GPU), power supply, data storage device (e.g., hard drive), and/or any other component of a computing device that produces heat during operation.

Computing device 100 further includes a hardware cooling device controller 106 configured to control activity of the cooling device. In some examples, the hardware cooling device controller may be specific to, and included as part of, the cooling device. In other examples, the hardware cooling device controller may be a component of the computing device (e.g., the device motherboard) that can be used with various different types or models of cooling devices compatible with the computing device.

The present disclosure primarily focuses on cooling devices taking the form of cooling fans. Thus, as used herein, "activity" of a cooling device may generally refer to rotational movement of a plurality of fan blades of a cooling fan in a manner that causes airflow—e.g., to regulate the temperature within the computing device housing. Therefore, as used herein, "activity" or "cooling activity" of a cooling device may refer to a current rotational speed of a cooling fan. However, it will be understood that the techniques described herein can also be applied to other types of cooling devices that regulate the temperature within a computing device housing via other suitable mechanisms, besides rotational movement of fan blades of a cooling fan. For example, the techniques described herein can be applied to a centrifugal cooling fan that generates airflow via rotation of an impeller, or to a liquid-based cooling device that regulates temperature via circulation of liquid coolant, as additional non-limiting examples. In general, "activity" of a cooling device refers to any process or mechanism by which a cooling device regulates (e.g., reduces) temperature within a housing of a computing device.

The cooling activity (e.g., rotational fan speed) of the cooling device may be dynamically scaled up or down by the hardware cooling device controller based on any number of suitable factors. For example, the computing device may include one or more temperature sensors configured to measure an internal temperature within the housing of the computing device and/or within close proximity to hardware component 104. As the internal temperature increases, the hardware cooling device controller may increase the cooling activity of the cooling device in an attempt to mitigate the temperature increase and prevent the computing device from overheating.

It will be understood, however, that the cooling activity of a cooling device may be controlled based on any suitable factors, in addition or as an alternative to an internal temperature within the housing of the computing device. For example, the cooling activity of the cooling device may be controlled based on a current operational status of the computing device (e.g., active vs "sleep" mode), based on a current battery level of the computing device (e.g., cooling device activity may be decreased to conserve battery), and/or the cooling activity of the cooling device may be controlled for any other suitable reason. Furthermore, as will be described in more detail below, a computing device may include more than one cooling device. In cases where two or more cooling devices are included, the cooling devices may be controlled together or independently, by the same or different hardware cooling device controllers.

It will be understood that computing device 100 is highly simplified for the sake of visual clarity, and that a "computing device" as described herein can include any number and variety of different computer components (e.g., motherboards, processors, storage devices, power sources, cooling devices), including components not explicitly described herein. Hardware cooling device controller 106 may be implemented as any suitable computer logic component, such as a processor or application-specific integrated circuit (ASIC). In some examples, computing device 100 may be implemented as computing system 900 described below with respect to FIG. 9.

In general, cooling activity of a cooling device (e.g., rotational movement of fan blades) produces noise that can be audible to a human user of the device, and/or other entities that may be nearby. The volume of the noise produced by the cooling device is generally proportional to the current activity of the cooling device. In other words, when the cooling device has relatively higher activity (e.g., higher rotational fan speed), the noise produced by the cooling device will likely be relatively louder. This can be compounded when the computing device includes multiple different cooling devices. As such, the noise produced by one or more different cooling devices of a computing device can become distracting or disruptive to human users in some scenarios—e.g., when the temperature within the housing of the computing device is relatively high.

Furthermore, a resource manager of the computing device (e.g., computer operating system, and/or other software/firmware configured to coordinate and control activity of hardware resources) often has limited information as to the current cooling activity of the cooling device—e.g., the current rotational speed of a cooling fan, and/or the current amount of noise being generated by the cooling device. This can make it difficult for the resource manager of the computing device to control behavior of software and/or hardware resources of the computing device in a manner that allows the cooling device activity to be reduced—e.g., for the purposes of reducing the amount of noise produced by the computing device, and/or to conserve electrical power of the computing device.

Accordingly, the present disclosure describes techniques for assessing and reporting the current cooling activity of a cooling device configured to regulate temperature within a housing of a computing device. Specifically, the computing device may include a cooling activity monitor and a cooling activity reporter corresponding to one or more cooling devices of the computing device. The cooling activity monitor and/or cooling activity reporter may in some cases be implemented by a hardware cooling device controller as described above—e.g., via firmware installed on the cooling device controller. Based at least in part on the current cooling activity of the cooling device crossing a predefined cooling activity threshold (e.g., a rotational fan speed crosses a predefined fan speed threshold), the cooling activity reporter may report a cooling activity indication to a resource manager (e.g., operating system) of the computing device. The predefined cooling activity threshold may, for example, correspond to a threshold between two different expected noise levels defined by an activity-to-noise map, and thus the cooling activity indication may serve as an indication of the expected amount of noise currently being produced by the cooling device. In this manner, the techniques described herein may beneficially provide the resource manager of the computing device with more insight into, and/or control over, the amount of noise produced by one or more cooling devices of the computing device.

Furthermore, the techniques described herein may beneficially provide the resource manager with more meaningful information regarding cooling device activity, without burdening the resource manager with an excessive amount of cooling device information. For instance, minor changes in cooling device activity are often not significant to the operation of the computing device as a whole, and frequent granular updates as to the current cooling activity of a cooling device can overwhelm processing and/or storage resources of the computing device. By contrast, the techniques described herein can provide more meaningful information regarding cooling device activity by reporting when the cooling device crosses predefined thresholds that may have a larger significance relative to operation of the computing device—e.g., because the thresholds correspond to certain expected noise levels, without burdening processing and/or storage resources of the computing device with irrelevant information relating to cooling device activity. Furthermore, the techniques described herein may enable cooling device noise to be evaluated and managed without requiring additional acoustic sensors—e.g., microphones—configured to monitor the actual amount of noise produced by any given cooling device. Accordingly, the techniques described herein may enable a computing device to achieve a more efficient balance between assessing and controlling cooling device activity, while enabling a relatively lower computational overhead for achieving such control.

Figure 2:
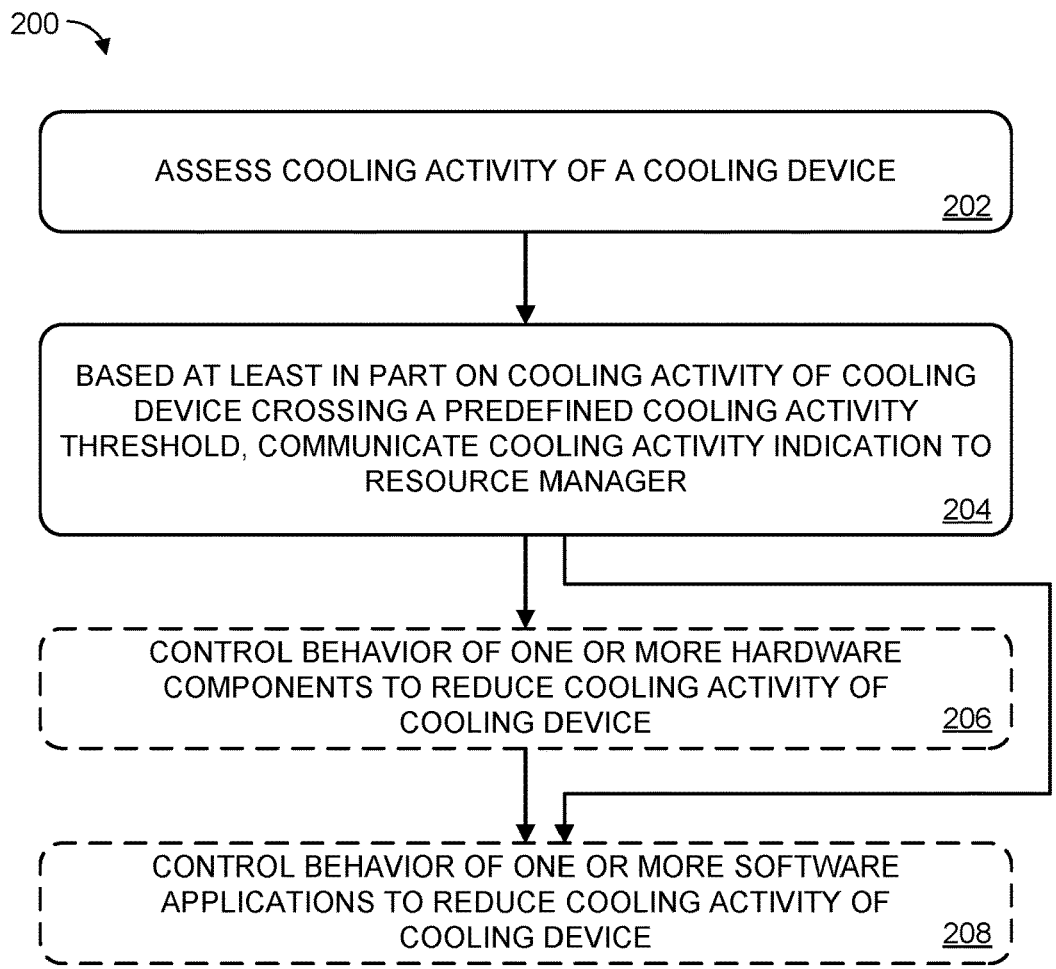
FIG. 2 illustrates an example method for cooling device activity reporting.

FIG. 2 illustrates an example method 200 for cooling device activity reporting. Method 200 may be implemented by any suitable logic or processing component of the computing device. As discussed above, the computing device may in some cases include one or more hardware cooling device controllers, configured to control activity of one or more different cooling devices of the computing device. Accordingly, method 200 may be performed by one or more different hardware cooling device controllers. The present disclosure primarily describes method 200 from the standpoint of a single hardware cooling device controller controlling a single cooling device. However, it will be understood that steps of method 200 may be performed by one or more different hardware cooling device controllers each associated with one or more different cooling devices. As indicated above, a hardware cooling device controller may be implemented as any suitable computer logic component, such as a processor or ASIC. In some examples, a hardware cooling device controller may be implemented as logic subsystem 902 described below with respect to FIG. 9.

Figure 3:
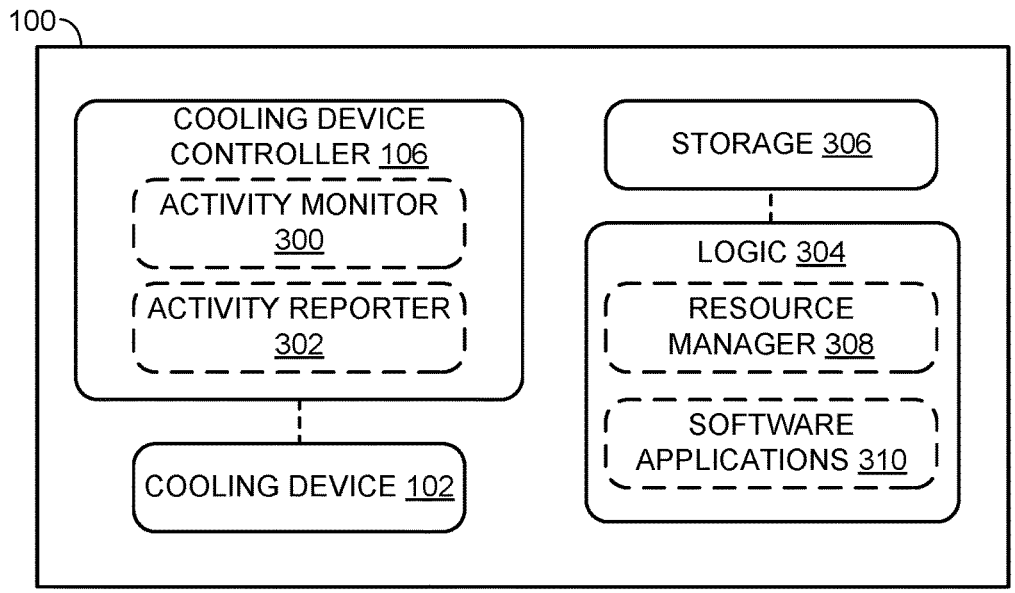
FIG. 3 schematically illustrates an example computing device including a cooling device.

At 202, method 200 includes assessing a cooling activity (e.g., rotational fan speed) of the cooling device. This may be done by a cooling activity monitor of the computing device—e.g., implemented via the hardware cooling device controller. FIG. 3 shows another schematic representation of computing device 100, including cooling device 102 and hardware cooling device controller 106. In this example, the hardware cooling device controller implements both a cooling activity monitor 300 and a cooling activity reporter 302. As will be described in more detail below, the cooling activity reporter may be configured to report indications of the cooling activity of the cooling device to a resource manager of the computing device based on one or more criteria.

The present disclosure primarily describes the cooling activity monitor and cooling activity reporter as being implemented by the hardware cooling device controller. For example, the cooling activity monitor and cooling activity reporter may be implemented in firmware installed on the hardware cooling device controller of the cooling device. However, it will be understood that the cooling activity monitor and/or cooling activity reporter may be implemented via any suitable software or firmware operable with any suitable hardware logic components of the computing device. Furthermore, the cooling activity monitor and cooling activity reporter need not be implemented by the same hardware logic component, but rather may be implemented by separate hardware logic components configured to cooperate to monitor and report information related to cooling device activity.

The cooling activity monitor may assess the cooling activity of the cooling device in any suitable way. In some cases, this may take the form of quantifying the current rate at which fan blades of a cooling fan are spinning—e.g., expressed in revolutions per minute (RPM)—where a higher rate of spin correlates to higher cooling activity and also more cooling device noise. In some cases, the cooling activity of the cooling device may be inferred from the amount of electrical power currently being supplied to the cooling device—e.g., the cooling device activity monitor may have information useable to correlate different fan speeds of a cooling fan with different electrical voltages supplied to a motor of the cooling fan. Additionally, or alternatively, the cooling activity of the cooling device may be determined in any other suitable way.

Returning briefly to FIG. 2, at 204, method 200 includes, based at least in part on the cooling activity of the cooling device crossing a predefined cooling activity threshold, communicating a cooling activity indication to a resource manager of the computing device. The cooling activity indication may be communicated by a cooling activity reporter—e.g., cooling activity reporter 302 of FIG. 3. As will be described in more detail below, the predefined cooling activity threshold may be one of a set of different thresholds maintained by the hardware cooling device controller (e.g., the cooling activity monitor), and the cooling activity reporter may communicate different cooling activity indications as the cooling activity of the cooling device changes and different cooling activity thresholds are crossed. These thresholds may, for example, correspond to thresholds between different expected cooling device noise levels (e.g., a "low" noise level, a "medium" noise level), as will be described in more detail below.

Regardless, however, the cooling activity monitor determines that the cooling activity of the cooling device has crossed a predefined cooling activity threshold, and therefore the cooling activity reporter communicates some indication of the cooling device's activity to the resource manager of the computing device. With reference to FIG. 3, computing device 100 includes a logic component 304 and data storage component 306. Logic component 304 and data storage component 306 collectively implement a resource manager 308 and one or more software applications 310 of computing device 100. The "resource manager" of the computing device may, for example, take the form of a computer operating system, and/or any other suitable software/firmware components configured to coordinate and/or control activity of hardware resources of the computing device. Thus, as will be described in more detail below, the resource manager may receive a cooling activity indication from the cooling activity reporter. From there, the resource manager may in some cases control behavior of one or more hardware and/or software resources of the computing device (e.g., software applications 310) to affect the activity of the cooling device—e.g., to reduce the amount of noise produced by the cooling device.

Logic component 304 and data storage component 306 may be implemented via any suitable combination of computer hardware. In many cases, logic component 304 may be separate from the hardware cooling device controller (e.g., logic component 304 may be implemented as a CPU). In other examples, however, the same hardware logic component may be used to implement any or all of cooling activity monitor 300, cooling activity reporter 302, resource manager 308, and software applications 310. In some cases, logic component 304 and data storage component 306 may be implemented as logic subsystem 902 and storage subsystem 904 described below with respect to FIG. 9.

Figure 4:
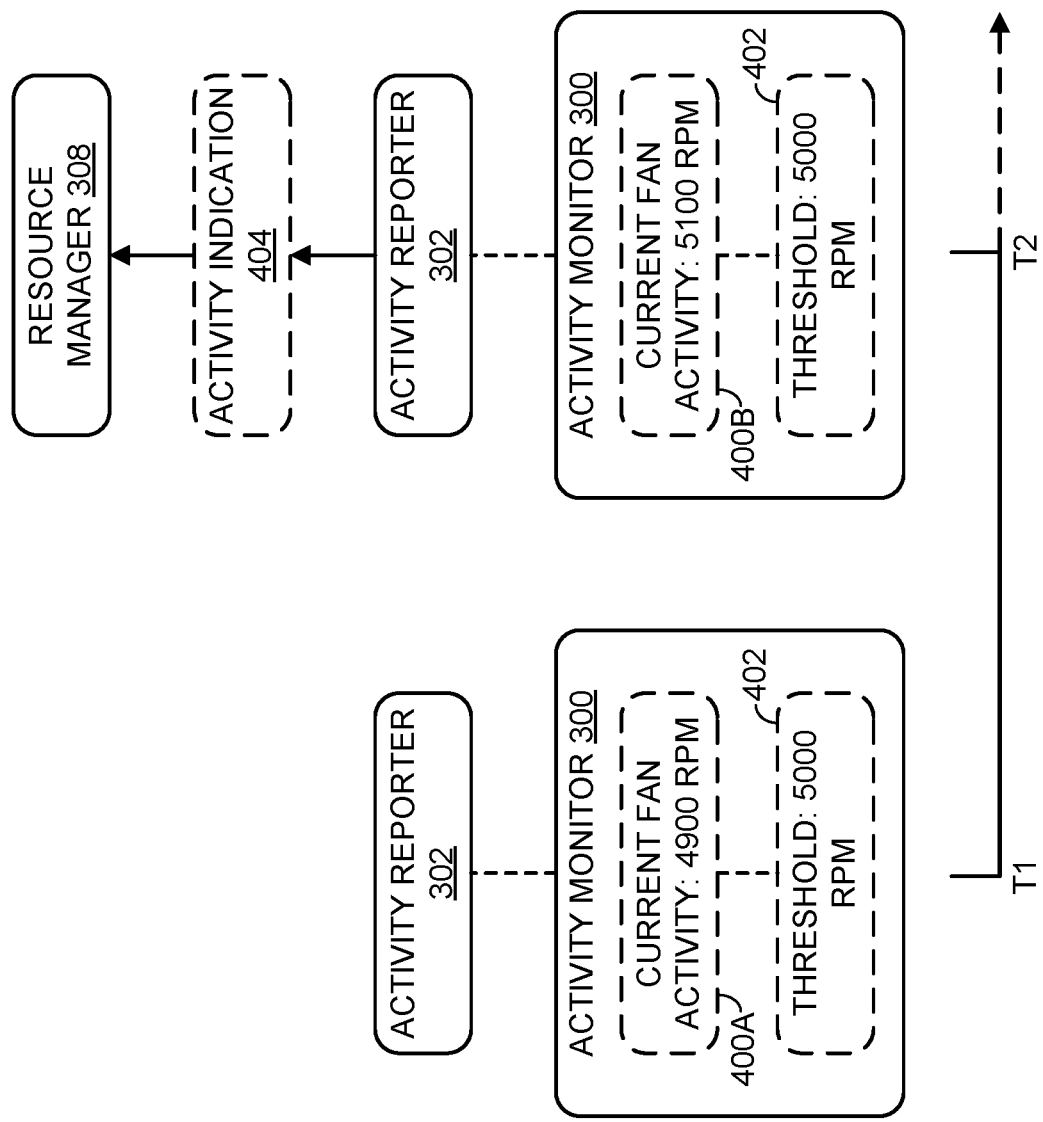
FIG. 4 schematically illustrates providing a cooling activity indication to resource manager of a computing device.

FIG. 4 schematically illustrates the process of communicating a cooling activity indication to a resource manager of a computing device. Specifically, FIG. 4 again shows cooling activity monitor 300 and cooling activity reporter 302 of computing device 100. In this example, the cooling device takes the form of a cooling fan. At a first time T1, the cooling activity monitor assesses the current cooling activity 400A of the cooling device as a rotational fan speed of 4900 RPM, and compares it to a predefined cooling activity threshold 402 of 5000 RPM. At a second time T2, after T1, the current cooling device activity 400B has increased to 5100 RPM and has therefore crossed the predefined cooling activity threshold of 5000 RPM. Accordingly, cooling activity reporter 302 reports a cooling activity indication 404 to resource manager 308 of computing device 100.

It will be understood that the specific cooling activity values used in FIG. 4 are non-limiting examples. In general, the predefined activity threshold may have any suitable value relative to the range of different cooling activity levels that the cooling device is capable of operating at, and this can vary from one implementation to another depending on the type of cooling device used. Similarly, any cooling device activity in addition to or instead of rotational fan speed measured in RPMs may be monitored and compared against predefined thresholds in this manner, and this disclosure applies equally to those implementations.

In the example of FIG. 4, the cooling activity indication was communicated to the resource manager by the cooling activity reporter because the current cooling activity crossed from below the predefined cooling activity threshold to above the predefined cooling activity threshold. It will be understood, however, that the cooling activity indication may in some cases be reported regardless of which direction the predefined cooling activity threshold was crossed—e.g., the cooling activity indication may be communicated when the current cooling activity of the cooling device crosses above the predefined cooling activity threshold, and/or crosses below the predefined cooling activity threshold.

The cooling activity indication may take any suitable form. As one example, the cooling activity indication may specify the value of the predefined cooling activity threshold that was crossed—e.g., 5000 RPM in the example of FIG. 4. As another example, the cooling activity indication may specify the current cooling activity of the cooling device at the time the cooling activity indication was generated—e.g., 5100 RPM in the example of FIG. 4. In cases where the predefined cooling activity threshold is one of two or more different predefined cooling activity thresholds maintained by the cooling activity monitor, the cooling activity indication may specify which of the two or more different predefined cooling activity thresholds was crossed—e.g., by specifying the cooling activity value corresponding to the crossed threshold, or by referencing an identifier value that corresponds to the crossed threshold. As another example, as will be described in more detail below, the predefined cooling activity threshold may correspond to a threshold between two different expected cooling device noise levels. Thus, the cooling activity indication may specify which noise level the cooling device is currently operating in, in addition to or as an alternative to specifying the current cooling activity of the cooling device or the value of the predefined cooling activity threshold.

The current cooling activity of the cooling device, and/or the determination as to whether the cooling device activity has crossed a predefined cooling activity threshold, may be assessed with any suitable frequency (e.g., corresponding to the time difference between T1 and T2 in FIG. 4). For example, the cooling activity monitor may assess the current cooling activity of the cooling device every second, every 5 seconds, every 10 seconds, etc. Similarly, regardless of the rate at which the cooling activity of the cooling device is assessed, the cooling activity monitor may compare the cooling activity of the cooling device to one or more predefined cooling activity thresholds with any suitable frequency. For example, even if the current cooling activity is assessed once every second, the cooling activity monitor may only evaluate whether any thresholds have been crossed every 5 seconds. This may serve to avoid generating a large number of cooling activity indications over a short time span that may not be significant to overall operation of the computing device—e.g., if the cooling activity of the cooling device rapidly oscillates from below a predefined cooling activity threshold to above the threshold.

Furthermore, in some examples, the cooling activity reporter may be configured to report the cooling activity of the cooling device to the resource manager of the computing device at a predetermined time interval regardless of whether the cooling activity of the cooling device crosses the predefined cooling activity threshold. Again, any suitable time interval may be used, such as once per minute, once every 5 minutes, or once every 15 minutes, etc., as non-limiting examples. This may enable the resource manager to collect telemetry data relating to the activity of the cooling device over time. Such telemetry data can be useful for determining, for example, whether a particular process or application is causing excessive cooling device activity.

The predefined cooling activity threshold may have any suitable source. In one example, the predefined cooling activity threshold may be specified by the resource manager of the computing device. For example, a device operating system may specify a plurality of cooling activity thresholds, and request that the hardware cooling device controller report each time the current cooling activity of the cooling device crosses one of the specified thresholds—e.g., enabling the operating system to collect diagnostic or telemetry data relating to cooling device activity. In some cases, the set of predefined cooling activity thresholds may be changed during operation of the computing device. For example, after the cooling activity reporter provides a cooling activity indication specifying that the cooling device activity has crossed a first cooling activity threshold previously defined by the resource manager of the computing device, the resource manager may specify a new, second cooling activity threshold, and request that the cooling activity reporter indicate when the second threshold is crossed.

As another example, the predefined cooling activity threshold may be specified by an activity-to-noise map—e.g., maintained by the cooling activity monitor. The activity-to-noise map may correlate different cooling activity values of the cooling device with a plurality of different cooling device noise levels. FIG. 5 schematically shows a non-limiting example of an activity-to-noise map 500. In this example, the cooling device takes the form of a cooling fan. Activity-to-noise map 500 correlates a plurality of different cooling activity values (expressed as rotational fan speed values measured in RPM) of the cooling device 502A, 502B, and 502C with a plurality of different cooling device noise levels 504A, 504B, and 504C. Specifically, cooling device activity values ranging between 1 and 5000 RPM correspond to a "low" noise level, while values between 5000 and 6500 RPM correspond to a "medium" noise level, and values higher than 6500 RPM correspond to a "high" noise level.

It will be understood that the different noise levels in the activity-to-noise map may be "expected" noise levels. In other words, the computing device need not include a microphone configured to measure the actual amount of noise being produced by one or more cooling devices of the computing device. Rather, the cooling device noise levels may indicate the amount of noise that different activity levels of the cooling device(s) are expected to produce—e.g., based on prior testing by the cooling device manufacturer, computing device manufacturer, system integrator, and/or end user. In practical scenarios, the actual amount of noise produced by cooling devices of the computing device may sometimes differ from what would be expected based on the activity-to-noise map.

As shown, the predefined cooling activity threshold of 5000 RPM from FIG. 4 corresponds to a noise threshold between two different cooling device noise levels of the plurality of different cooling device noise levels—e.g., the "low" and "medium" noise levels of activity-to-noise map 500. As discussed above, in some cases the cooling activity indication communicated to the resource manager may specify a cooling device noise level of the plurality of different cooling device noise levels that the cooling activity of the cooling device corresponds to, according to the activity-to-noise map. Thus, using the example of activity-to-noise map 500, the cooling activity indication 404 of FIG. 4 may specify that the cooling device is currently operating in the "medium" noise level. In cases where the noise level is specified by the cooling activity indication, the resource manager may have prior information relating different cooling activity values to different noise levels. For example, upon device boot (and/or at any other suitable time), the hardware cooling device controller may communicate some or all information of the activity-to-noise map to the operating system.

It will be understood that, in cases where the cooling activity monitor maintains two or more different predefined cooling activity thresholds, the different thresholds may have different sources. For example, some predefined cooling activity thresholds may correspond to noise thresholds in an activity-to-noise map, while other predefined cooling activity thresholds may be specified by the resource manager of the computing device and unrelated to the activity-to-noise map. By specifying different predefined cooling activity thresholds, the resource manager can, for example, collect information regarding how different processes running on the computing device affect cooling device noise—e.g., the resource manager may receive an indication that a predefined threshold was crossed after a new software process was started. Thus, as a technical benefit, the resource manager may be able to more effectively control cooling device noise in the future. For instance, in a situation where the cooling device is producing relatively high noise, the resource manager may terminate one or more software processes that it has determined to have a high impact on cooling device activity, based on prior data collected by specifying different predetermined cooling activity thresholds for the hardware cooling device controller to monitor.

In the example of FIG. 5, the activity-to-noise map specifies three different noise levels, and each different noise level is associated with a different human-readable name. It will be understood, however, that this is not limiting. Rather, in other examples, an activity-to-noise map may specify any suitable number of different noise levels—e.g., two levels, five levels, or ten levels. Furthermore, the different noise levels may be referred to in any suitable way, and need not use explicit human-readable labels such as "low" or "high." Rather, the different noise levels may be referenced with different numerical identifier values, for example. In cases where human-readable labels are used, it will be understood that the specific human-readable labels "low," "medium," and "high," used in FIG. 5 are non-limiting examples.

An activity-to-noise map may have any suitable source. In one example, the activity-to-noise map may be preinstalled on the hardware cooling device controller of the cooling device—e.g., by a manufacturer of the cooling device or a manufacturer of the computing device. For instance, different cooling device models produced by the same or different manufacturers will likely produce different amounts of noise depending on their current activity (e.g., rotational fan speed). Thus, cooling device manufacturers and/or computing device manufacturers may generate activity-to-noise maps and provide such maps along with the cooling devices they sell—e.g., installed on firmware of a hardware cooling device controller integrated into the cooling device. Implementing the activity-to-noise map on the hardware cooling device controller may provide a technical benefit in that it has more direct insight into, and control over, the current activity of the cooling device, and is thereby able to more effectively monitor and control cooling device noise than would be possible for the resource manager. Furthermore, by tasking the hardware cooling device controller with storing and evaluating the activity-to-noise map, storage and processing resources of other components of the computing device may be conserved.

As another example, activity-to-noise maps may not be preinstalled on a hardware cooling device controller, but rather may be installable (e.g., by flashing firmware) by an end-user or system integrator. In this manner, the activity-to-noise map can be updated over time—e.g., if the cooling device manufacturer (or other suitable party) produces an updated activity-to-noise map for a particular cooling device, updated firmware including the updated activity-to-noise map may be installed on the hardware cooling device controller, and/or other suitable hardware logic component of the computing device.

As another example, the activity-to-noise map may be developed over time by the computing device itself. For example, the computing device may be equipped with a microphone configured to detect the amount of noise produced by one or more cooling devices of the computing device during operation. A user of the computing device, and/or a software application of the computing device, may define different noise levels corresponding to noise produced by one or more cooling devices of the computing device. By assessing the cooling activity (e.g., rotational fan speed) of the cooling device while different amounts of noise are detected by the microphone, the activity-to-noise map may be iteratively developed.

The present disclosure has thus far primarily assumed that the hardware cooling device controller will only maintain one activity-to-noise map for the computing device. However, some computing devices can assume different configurations having different expected acoustic properties. As with the noise levels of the activity-to-noise map, acoustic properties of a computing device may be "expected" acoustic properties—e.g., properties that the device is expected to have based on prior testing or modeling, which may differ from the actual acoustic properties of the device in some real-world settings. Thus, it can be beneficial to implement multiple different activity-to-noise maps for different configurations of the same computing device, as the device may produce different amounts of noise (and/or the amount of noise produced by a device can be perceived differently) depending on its current configuration. Thus, as a technical benefit of implementing multiple different activity-to-noise maps, the amount of noise produced by any given computing device can be more effectively monitored and controlled regardless of its current configuration (e.g., laptop open vs closed).

Figure 6A:
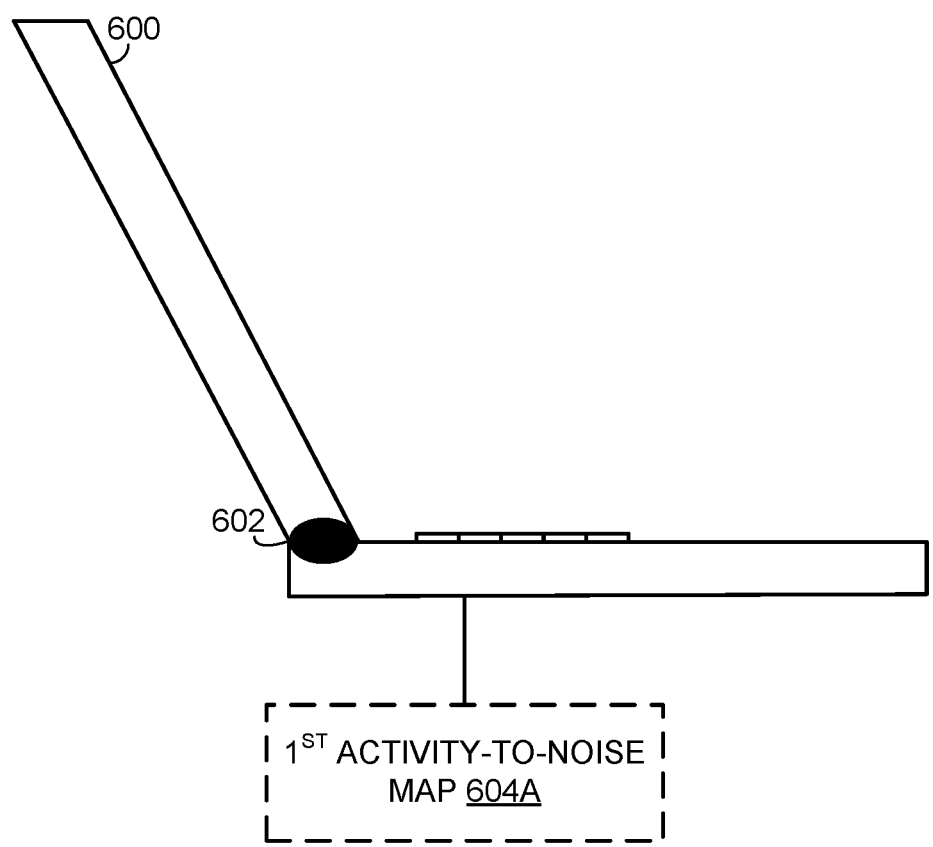
FIGS. 6A and 6B schematically show two different configurations of a computing device having different acoustic properties.
Figure 6B:
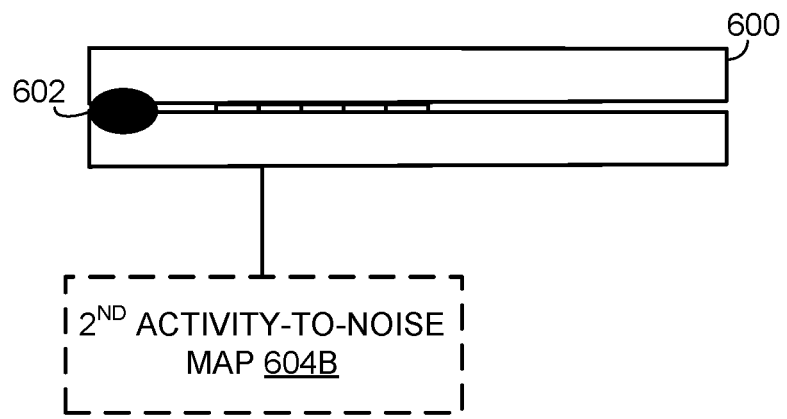

FIGS. 6A and 6B schematically show one such computing device 600, taking the form of a laptop computer. Via a hinge 602, a display portion of the laptop can be rotated relative to a base portion of the laptop. Depending on the current relationship between the display and base portions of the laptop, the amount of noise produced by one or more cooling devices of computing device 600, and/or the level of distraction corresponding to different amounts of cooling device noise, can change. For example, depending on how the one or more cooling devices are arranged within computing device 600, some configurations of the computing device may result in relatively more or less noise from the cooling devices reaching a human user of the computing device. Similarly, even when the actual amount of noise produced by the cooling devices remains unchanged, the user's perception of such noise can vary depending on the computing device's configuration. For example, the same amount of cooling device noise may be perceived as more distracting when the laptop is in a closed configuration, as opposed to an open configuration.

Accordingly, in some examples, an activity-to-noise map of the computing device (e.g., maintained by the hardware cooling device controller) may be a first activity-to-noise map corresponding to a first configuration of the computing device having first acoustic properties. In the example of FIG. 6A, a first activity-to-noise map 604A specifies one or more predefined cooling activity thresholds to be used when the computing device uses the open configuration depicted in FIG. 6A. By contrast, in FIG. 6B, a second activity-to-noise map 604B specifies a different set of predefined activity thresholds to be used when the computing device has the closed configuration depicted in FIG. 6B. For example, predefined cooling activity threshold 402 of FIG. 4 may be one of a first set of predefined cooling activity thresholds specified by first activity-to-noise map 604A, while second activity-to-noise map 604B specifies a second set of predefined cooling activity thresholds, different from the first set of predefined cooling activity thresholds.

As discussed above, upon detecting that the current cooling activity of a cooling device has crossed a predefined cooling activity threshold, the cooling activity reporter may communicate a cooling activity indication to a resource manager of the computing device. The resource manager may use information relating to the activity of the cooling device in any suitable way. For example, the resource manager of the computing device may be configured to make the cooling activity indicator available to one or more software applications of the computing device. Software applications may be programmed to control their behavior based on cooling device activity in a more granular and efficient manner than would be possible if cooling device activity was only available to the resource manager itself.

Figure 7:
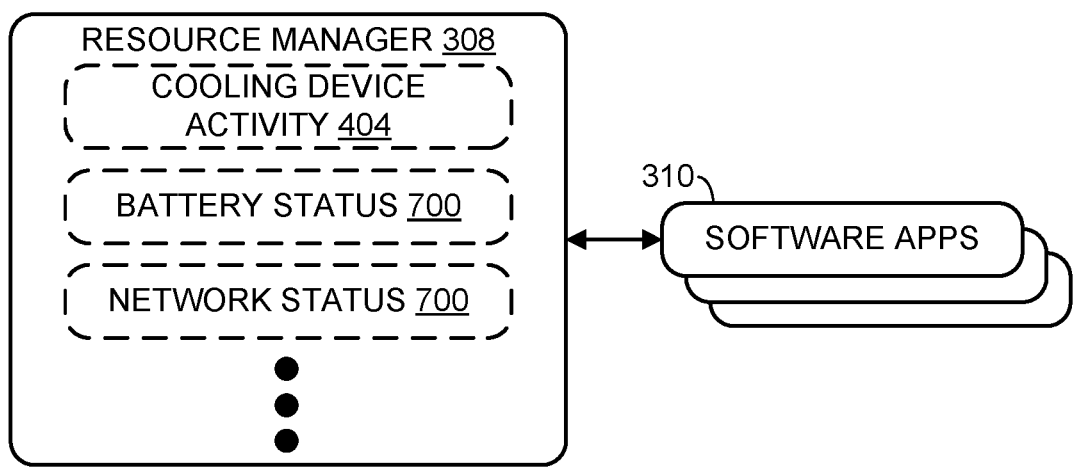
FIG. 7 schematically illustrates a resource manager providing cooling device activity information to software applications of the computing device.

This is schematically illustrated with respect to FIG. 7, in which resource manager 308 of computing device 100 aggregates various types of information relating to the current status of the computing device, and makes such information accessible to the one or more software applications 310 running on the device—e.g., via an application programming interface (API) implemented by an operating system of the computing device. As non-limiting examples, the aggregated information includes the cooling activity indicator 404, a current battery status 700 of the computing device (e.g., battery charge level, whether the device is plugged in to an electrical outlet), and a current network status 700 of the computing device (e.g., whether the device is currently connected to a computer network, whether the connection is wired or wireless, whether the device is currently transmitting or receiving data over the network). It will be understood that the resource manager of the computing device may aggregate any suitable type of information for access by the software applications, in addition to or instead of the specific types of information described herein.

In some examples, any or all software applications 310 of the computing device may be programmed to subscribe to, and/or otherwise access, any or all of the information aggregated by the resource manager. Accordingly, the software applications may be programmed to alter their behavior based on the aggregated information. As one non-limiting example, a software application may be in the midst of an indexing operation currently running as a background process. However, after determining from cooling activity indication 404 that the cooling device of the computing device is currently operating at a "high" noise level, the software application may be configured to defer or suspend the indexing operation in order to reduce the overall computational load handled by the computing device. This may result in less heat being produced by the computing device, which in turn enables the cooling activity to be reduced, lowering the amount of noise produced by the computing device. By contrast, if the cooling activity indication shows that the cooling device is currently operating at a "low" noise level, the software application may be configured to continue the indexing operation, or even request that additional resources of the computing device (e.g., processor cores) be tasked with the indexing operation.

As discussed above, the cooling activity indication may in some cases specify the current expected noise level of the cooling device. This may beneficially simplify programming of software applications to respond to different levels of cooling device activity, as discussed above. For example, different cooling devices, and/or different computing devices, may produce different amounts of noise for a given amount of cooling device activity (e.g., rotational fan speed). Accordingly, providing a software application with the numerical cooling device activity value (e.g., fan speed in RPM) may not be helpful in evaluating whether the software application should change its behavior—e.g., by suspending or terminating processes—as the same software application may run on many different computing devices, equipped with cooling devices that make different amounts of noise at the same level of cooling device activity. By contrast, when the cooling activity indication specifies an expected noise value for a cooling device, a software application may be programmed to modify its behavior based on the expected noise level, without requiring more granular information as to the type of cooling device being used, and/or without requiring cooling device-related tailoring for different types of computing devices.

It will be understood that the scenario given above is non-limiting. In general, software applications of a computing device may be programmed to take any suitable action in response to information regarding the current activity of a cooling device, including no action. Furthermore, software applications may consider the current cooling device activity in tandem with any other information aggregated by the resource manager. To reuse in the above example, if the software application performing the indexing operation determines that the cooling device noise level is "low" based on the cooling activity indication, but also determines that the battery level of the computing device is low, then the software application may be configured to defer or suspend the indexing operation to conserve electrical power of the device. Notably, electrical power may be conserved both by reducing the computational workload of the device (and thereby reducing the power consumed by logic components handling the workload), and also by reducing the amount of electrical power used to drive the cooling device. In general, any or all computing devices installed on the computing device may be programmed to use different sets of heuristics to determine whether to perform any given operation, based on the current cooling device activity and/or any other information aggregated by the resource manager.

Additionally, or alternatively, the resource manager may control behavior of one or more hardware and/or software resources of the computing device based on the cooling activity indication. As such, returning briefly to FIG. 2, at 206, method 200 optionally includes, based at least in part on the cooling activity indication, controlling behavior of one or more hardware components of the computing device to reduce the cooling activity of the cooling device. This may include, as non-limiting examples, reducing the operating frequency of one or more processors of the computing device, disabling one or more processing cores of one or more processors of the computing device, suspending use of a discrete graphics card in favor of an integrated graphics card, etc. In general, the resource manager of the computing device may control any or all hardware components of the computing device in an attempt to reduce the amount of heat generated by such components, thereby reducing the amount of noise produced by one or more cooling devices of the computing device.

Continuing with FIG. 2, at 208, method 200 optionally includes, based at least in part on the cooling activity indication, controlling behavior of one or more software applications of the computing device to reduce the cooling activity of the cooling device. Notably, the resource manager may perform either, both, or neither of steps 206 and 208 of method 200. As one example, the resource manager may have some indication (e.g., via quality of service (QoS) reporting) of whether different software processes are background processes or foreground processes. From there, the resource manager may suspend, or reduce the hardware resources (e.g., processor cores, volatile memory) reserved for, any background processes in an attempt to reduce the heat generated by hardware components of the computing device handling such background processes. It may be beneficial to primarily target background processes, in order to minimize disruption to the human user of the computing device. As another example, however, the resource manager may throttle, suspend, or terminate any software applications identified as contributing to a high level of cooling device activity even if such applications are running foreground processes—e.g., because such software applications are performing resource-intensive processes generating a relatively large amount of heat.

The present disclosure has primarily focused on monitoring and reporting information relating to the current activity of a single cooling device of a computing device. However, as discussed above, a computing device may include two or more different cooling devices. Such cooling devices may be controlled by the same or different hardware cooling device controllers. Furthermore, different cooling devices may be different cooling device models from the same or different manufacturers, and therefore produce different amounts of noise for the same level of activity. Additionally, different cooling devices may be configured to regulate the temperature of different components of the computing device—e.g., one cooling fan may direct airflow toward a CPU of the computing device, while another cooling fan directs airflow toward a GPU of the computing device.

Figure 8:
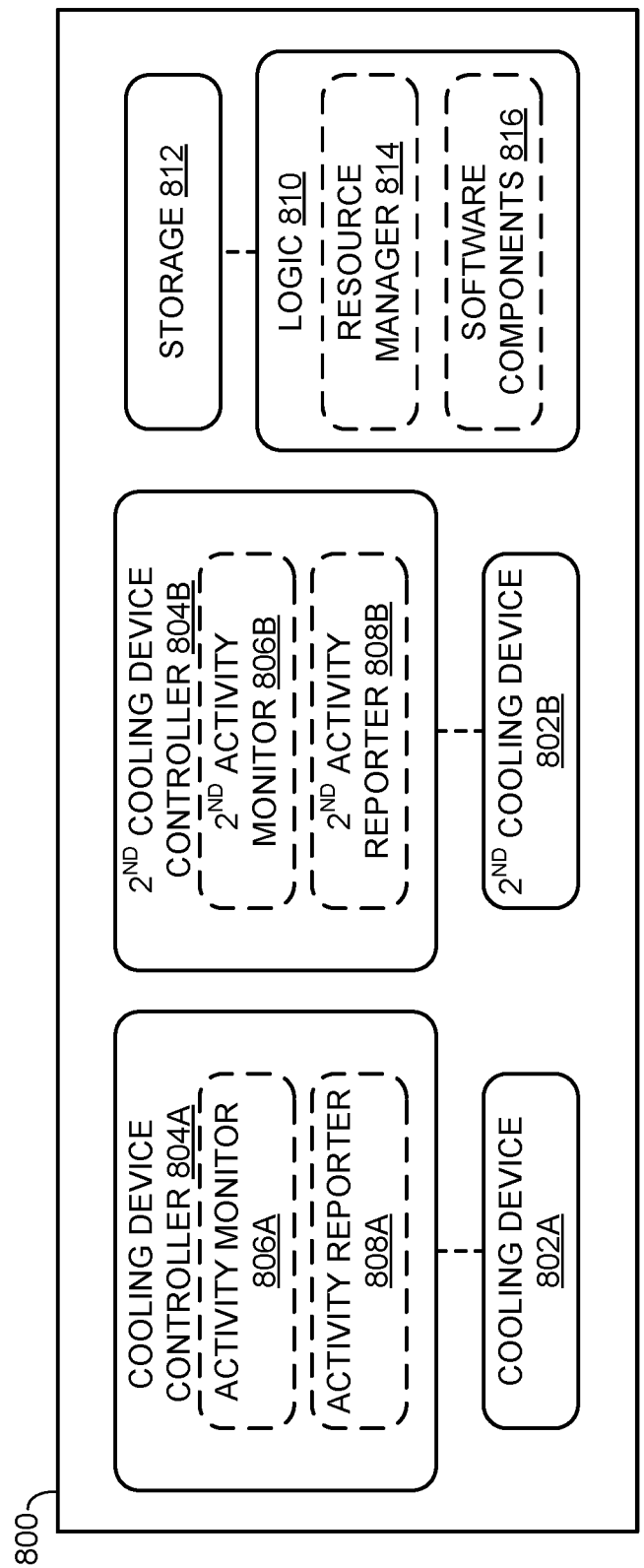
FIG. 8 schematically shows another example computing device including two cooling devices.

FIG. 8 schematically shows another example computing device 800, which includes a first cooling device 802A and a second cooling device 802B. As with computing device 100, computing device 800 includes a hardware cooling device controller 804A configured to control first cooling device 802A and implement a cooling activity monitor 806A and cooling activity reporter 808A. In this example, computing device 800 further includes a second hardware cooling device controller 804B, configured to implement a second cooling activity monitor 806B and a second cooling activity reporter 808B. The second cooling activity monitor may be configured to assess a cooling activity of the second cooling device, as described above with respect to cooling activity monitor 300. Similarly, the second cooling activity reporter may be configured to, based at least in part on the cooling activity of the second cooling device crossing a second predefined cooling activity threshold, communicate a second cooling activity indication to the resource manager of the computing device. This may be done substantially as described above with respect to cooling activity reporter 302 and cooling activity indication 404.

Notably, different cooling devices of the computing device may produce different amounts of noise based on physical differences between the cooling devices (e.g., different cooling device models), different locations within the housing of the computing device, and different levels of activity of hardware components that the different cooling devices are intended to cool. Thus, any predefined cooling activity thresholds maintained by hardware cooling device controller 804A may in some cases differ from predefined cooling activity thresholds maintained by hardware cooling device controller 804B. For example, each different hardware cooling device controller may maintain one or more different activity-to-noise maps for each different cooling device.

In the example of FIG. 8, the computing device includes separate hardware cooling device controllers for each cooling device. It will be understood that, in other examples, the same hardware cooling device controller may control two or more different cooling devices. For example, a computing device may include two or more different cooling devices, and only include one hardware cooling device controller configured to control each of the two or more different cooling devices. Similarly, activity relating to different cooling devices may be assessed and reported by the same or different cooling activity monitors and cooling activity reporters.

In cases where the computing device has two or more different cooling devices, the resource manager and/or software applications of the computing device may respond to cooling activity indications corresponding to the different cooling devices in different ways. As one non-limiting example, if one cooling fan configured to direct airflow toward a GPU is running at relatively high speed, then the activity of any software processes contributing to GPU activity may be reduced. However, the behavior of any software processes that are primarily implemented by the computer CPU, as opposed to the GPU, may remain relatively unchanged. For example, a video game application may be programmed to reduce its graphical settings upon receiving an indication that the GPU cooling fan speed is relatively high, while a different software application running an indexing operation may refrain from changing its behavior based on the status of the GPU cooling fan.

The methods and processes described herein may be tied to a computing system of one or more computing devices. In particular, such methods and processes may be implemented as an executable computer-application program, a network-accessible computing service, an application-programming interface (API), a library, or a combination of the above and/or other compute resources. Any or all of computing device 100, computing device 600, and computing device 800 described above may be implemented as computing system 900.

Figure 9:
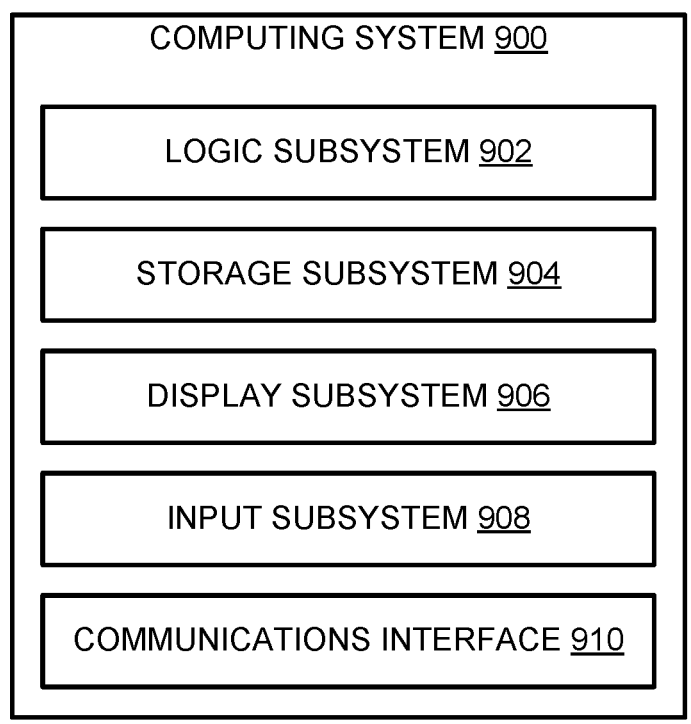
FIG. 9 schematically shows an example computing system.

FIG. 9 schematically shows a simplified representation of a computing system 900 configured to provide any to all of the compute functionality described herein. Computing system 900 may take the form of one or more personal computers, network-accessible server computers, tablet computers, home-entertainment computers, gaming devices, mobile computing devices, mobile communication devices (e.g., smart phone), virtual/augmented/mixed reality computing devices, wearable computing devices, Internet of Things (IoT) devices, embedded computing devices, and/or other computing devices.

Computing system 900 includes a logic subsystem 902 and a storage subsystem 904. Computing system 900 may optionally include a display subsystem 906, input subsystem 908, communication subsystem 910, and/or other subsystems not shown in FIG. 9.

Logic subsystem 902 includes one or more physical devices configured to execute instructions. For example, the logic subsystem may be configured to execute instructions that are part of one or more applications, services, or other logical constructs. Any or all of hardware cooling device controller 106, logic component 304, hardware cooling device controller 804A, and hardware cooling device controller 804B may be implemented as logic subsystem 904. The logic subsystem may include one or more hardware processors configured to execute software instructions. Additionally, or alternatively, the logic subsystem may include one or more hardware or firmware devices configured to execute hardware or firmware instructions. Processors of the logic subsystem may be single-core or multi-core, and the instructions executed thereon may be configured for sequential, parallel, and/or distributed processing. Individual components of the logic subsystem optionally may be distributed among two or more separate devices, which may be remotely located and/or configured for coordinated processing. Aspects of the logic subsystem may be virtualized and executed by remotely-accessible, networked computing devices configured in a cloud-computing configuration.

Storage subsystem 904 includes one or more physical devices configured to temporarily and/or permanently hold computer information such as data and instructions executable by the logic subsystem. When the storage subsystem includes two or more devices, the devices may be collocated and/or remotely located. Storage subsystem 904 may include volatile, nonvolatile, dynamic, static, read/write, read-only, random-access, sequential-access, location-addressable, file-addressable, and/or content-addressable devices. Storage subsystem 904 may include removable and/or built-in devices. When the logic subsystem executes instructions, the state of storage subsystem 904 may be transformed—e.g., to hold different data.

Aspects of logic subsystem 902 and storage subsystem 904 may be integrated together into one or more hardware-logic components. Such hardware-logic components may include program- and application-specific integrated circuits (PASIC/ASICs), program- and application-specific standard products (PSSP/ASSPs), system-on-a-chip (SOC), and complex programmable logic devices (CPLDs), for example.

The logic subsystem and the storage subsystem may cooperate to instantiate one or more logic machines. As used herein, the term "machine" is used to collectively refer to the combination of hardware, firmware, software, instructions, and/or any other components cooperating to provide computer functionality. In other words, "machines" are never abstract ideas and always have a tangible form. A machine may be instantiated by a single computing device, or a machine may include two or more sub-components instantiated by two or more different computing devices. In some implementations a machine includes a local component (e.g., software application executed by a computer processor) cooperating with a remote component (e.g., cloud computing service provided by a network of server computers). The software and/or other instructions that give a particular machine its functionality may optionally be saved as one or more unexecuted modules on one or more suitable storage devices.

When included, display subsystem 906 may be used to present a visual representation of data held by storage subsystem 904. This visual representation may take the form of a graphical user interface (GUI). Display subsystem 906 may include one or more display devices utilizing virtually any type of technology. In some implementations, display subsystem may include one or more virtual-, augmented-, or mixed reality displays.

When included, input subsystem 908 may comprise or interface with one or more input devices. An input device may include a sensor device or a user input device. Examples of user input devices include a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition.

When included, communication subsystem 910 may be configured to communicatively couple computing system 900 with one or more other computing devices. Communication subsystem 910 may include wired and/or wireless communication devices compatible with one or more different communication protocols. The communication subsystem may be configured for communication via personal-, local- and/or wide-area networks.

This disclosure is presented by way of example and with reference to the associated drawing figures. Components, process steps, and other elements that may be substantially the same in one or more of the figures are identified coordinately and are described with minimal repetition. It will be noted, however, that elements identified coordinately may also differ to some degree. It will be further noted that some figures may be schematic and not drawn to scale. The various drawing scales, aspect ratios, and numbers of components shown in the figures may be purposely distorted to make certain features or relationships easier to see.

In an example, a computing device comprises: a cooling device; a cooling activity monitor configured to assess a cooling activity of the cooling device; and a cooling activity reporter configured to, based at least in part on the cooling activity of the cooling device crossing a predefined cooling activity threshold, communicate a cooling activity indication to a resource manager of the computing device. In this example or any other example, the cooling device is a cooling fan, and the cooling activity of the cooling fan is a rotational fan speed of the cooling fan. In this example or any other example, the predefined cooling activity threshold is specified by an activity-to-noise map correlating different cooling activity values of the cooling device with a plurality of different cooling device noise levels. In this example or any other example, the predefined cooling activity threshold corresponds to a noise threshold between two different cooling device noise levels of the plurality of different cooling device noise levels. In this example or any other example, the cooling activity indication specifies a cooling device noise level of the plurality of different cooling device noise levels to which the cooling activity of the cooling device corresponds, according to the activity-to-noise map. In this example or any other example, the activity-to-noise map is a first activity-to-noise map corresponding to a first configuration of the computing device having first acoustic properties, and a second activity-to-noise map corresponds to a second configuration of the computing device having second acoustic properties. In this example or any other example, the predefined cooling activity threshold is one of a first set of predefined cooling activity thresholds specified by the first activity-to-noise map, and the second activity-to-noise map specifies a second set of predefined cooling activity thresholds, different from the first set of predefined cooling activity thresholds. In this example or any other example, the predefined cooling activity threshold is specified by the resource manager of the computing device. In this example or any other example, the predefined cooling activity threshold is one of two or more different predefined cooling activity thresholds, and the cooling activity indication specifies which of the two or more different predefined cooling activity thresholds is crossed. In this example or any other example, the resource manager of the computing device is configured to, based at least in part on the cooling activity indication, control behavior of one or more hardware components of the computing device to reduce the cooling activity of the cooling device. In this example or any other example, the resource manager of the computing device is configured to, based at least in part on the cooling activity indication, control behavior of one or more software applications of the computing device to reduce the cooling activity of the cooling device. In this example or any other example, the resource manager of the computing device is configured to make the cooling activity indication available to one or more software applications of the computing device. In this example or any other example, the computing device further comprises: a second cooling device; a second cooling activity monitor configured to assess a cooling activity of the second cooling device; and a second cooling activity reporter configured to, based at least in part on the cooling activity of the second cooling device crossing a second predefined cooling activity threshold, communicate a second cooling activity indication to the resource manager of the computing device. In this example or any other example, the cooling activity monitor and the cooling activity reporter are implemented in firmware installed on a hardware cooling device controller of the cooling device. In this example or any other example, the cooling activity reporter is further configured to report the cooling activity of the cooling device to the resource manager of the computing device at a predetermined time interval regardless of whether the cooling activity of the cooling device crosses the predefined cooling activity threshold.

In an example, a method for computing device cooling comprises: at a hardware cooling device controller configured to control a cooling device of a computing device, assessing a cooling activity of the cooling device; and based at least in part on the cooling activity of the cooling device crossing a predefined cooling activity threshold, communicating a cooling activity indication to a resource manager of the computing device. In this example or any other example, the predefined cooling activity threshold is specified by an activity-to-noise map maintained by the hardware cooling device controller, the activity-to-noise map correlating different cooling activity values of the cooling device with a plurality of different cooling device noise levels. In this example or any other example, the predefined cooling activity threshold corresponds to a noise threshold between two different cooling device noise levels of the plurality of different cooling device noise levels. In this example or any other example, the cooling activity indication specifies a cooling device noise level of the plurality of different cooling device noise levels that the cooling activity of the cooling device corresponds to, according to the activity-to-noise map.

In an example, a computing device comprises: a cooling fan; a cooling activity monitor configured to assess a rotational fan speed of the cooling fan; and a cooling activity reporter configured to, based at least in part on the rotational fan speed of the cooling fan crossing a predefined cooling activity threshold, communicate a cooling activity indication to a resource manager of the computing device, the resource manager of the computing device configured to, based at least in part on the cooling activity indication, control one or both of one or more hardware components of the computing device and one or more software applications of the computing device to reduce the rotational fan speed of the cooling fan.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A computing device, comprising:
   a first portion;
   a second portion rotatably coupled with the first portion via a hinge;
   a cooling device;
   a cooling activity monitor configured to assess a cooling activity of the cooling device; and
   a cooling activity reporter configured to, based at least in part on the cooling activity of the cooling device crossing a predefined cooling activity threshold specified by a first activity-to-noise map, communicate a cooling activity indication to a resource manager of the computing device, wherein the first activity-to-noise map corresponds to an open configuration of the computing device having first acoustic properties, the open configuration associated with a first hinge angle between the first portion and the second portion, and wherein a second activity-to-noise map corresponds to a closed configuration of the computing device having second acoustic properties, the closed configuration associated with a second hinge angle between the first portion and the second portion, and wherein the resource manager is configured to, based at least in part on the cooling activity indication, control behavior of one or more software applications by terminating one or more software processes to reduce the cooling activity of the cooling device.

2. The computing device of claim 1, wherein the cooling device is a cooling fan, and wherein the cooling activity of the cooling fan is a rotational fan speed of the cooling fan.

3. The computing device of claim 1, wherein the first activity-to-noise map correlates different cooling activity values of the cooling device with a plurality of different cooling device noise levels.

4. The computing device of claim 3, wherein the predefined cooling activity threshold corresponds to a noise threshold between two different cooling device noise levels of the plurality of different cooling device noise levels.

5. The computing device of claim 3, wherein the cooling activity indication specifies a cooling device noise level of the plurality of different cooling device noise levels to which the cooling activity of the cooling device corresponds, according to the first activity-to-noise map.

6. The computing device of claim 1, wherein the predefined cooling activity threshold is one of a first set of predefined cooling activity thresholds specified by the first activity-to-noise map, and wherein the second activity-to-noise map specifies a second set of predefined cooling activity thresholds, different from the first set of predefined cooling activity thresholds.

7. The computing device of claim 1, wherein the predefined cooling activity threshold is specified by the resource manager of the computing device.

8. The computing device of claim 1, wherein the predefined cooling activity threshold is one of two or more different predefined cooling activity thresholds, and the cooling activity indication specifies which of the two or more different predefined cooling activity thresholds is crossed.

9. The computing device of claim 1, wherein the resource manager of the computing device is configured to, based at least in part on the cooling activity indication, control behavior of one or more hardware components of the computing device to reduce the cooling activity of the cooling device.

10. The computing device of claim 1, wherein the resource manager of the computing device is configured to make the cooling activity indication available to the one or more software applications of the computing device.

11. The computing device of claim 1, further comprising:
   a second cooling device;
   a second cooling activity monitor configured to assess a cooling activity of the second cooling device; and a second cooling activity reporter configured to, based at least in part on the cooling activity of the second cooling device crossing a second predefined cooling activity threshold, communicate a second cooling activity indication to the resource manager of the computing device.

12. The computing device of claim 1, wherein the cooling activity monitor and the cooling activity reporter are implemented in firmware installed on a hardware cooling device controller of the cooling device.

13. The computing device of claim 1, wherein the cooling activity reporter is further configured to report the cooling activity of the cooling device to the resource manager of the computing device at a predetermined time interval regardless of whether the cooling activity of the cooling device crosses the predefined cooling activity threshold.

14. A method for computing device cooling, comprising:
at a hardware cooling device controller configured to control a cooling device of a computing device, assessing a cooling activity of the cooling device, wherein the computing device includes a first portion and a second portion rotatably coupled with the first portion via a hinge; and
based at least in part on the cooling activity of the cooling device crossing a predefined cooling activity threshold specified by a first activity-to-noise map, communicating a cooling activity indication to a resource manager of the computing device, wherein the first activity-to-noise map corresponds to an open configuration of the computing device having first acoustic properties, the open configuration associated with a first hinge angle between the first portion and the second portion, and wherein a second activity-to-noise map corresponds to a closed configuration of the computing device having second acoustic properties, the closed configuration associated with a second hinge angle between the first portion and the second portion, and wherein the resource manager is configured to, based at least in part on the cooling activity indication, control behavior of one or more software applications by terminating one or more software processes to reduce the cooling activity of the cooling device.

15. The method of claim 14, wherein the first activity-to-noise map is maintained by the hardware cooling device controller and correlates different cooling activity values of the cooling device with a plurality of different cooling device noise levels.

16. The method of claim 15, wherein the predefined cooling activity threshold corresponds to a noise threshold between two different cooling device noise levels of the plurality of different cooling device noise levels.

17. The method of claim 15, wherein the cooling activity indication specifies a cooling device noise level of the plurality of different cooling device noise levels that the cooling activity of the cooling device corresponds to, according to the activity-to-noise map.

18. A computing device, comprising:
a first portion;
a second portion rotatably coupled with the first portion via a hinge;
a cooling fan;
a cooling activity monitor configured to assess a rotational fan speed of the cooling fan; and
a cooling activity reporter configured to, based at least in part on the rotational fan speed of the cooling fan crossing a predefined cooling activity threshold specified by a first activity-to-noise map, communicate a cooling activity indication to a resource manager of the computing device, the resource manager of the computing device configured to, based at least in part on the cooling activity indication, control one or more software applications of the computing device by terminating one or more software processes to reduce the rotational fan speed of the cooling fan, wherein the first activity-to-noise map corresponds to an open configuration of the computing device having first acoustic properties, the open configuration associated with a first hinge angle between the first portion and the second portion, and wherein a second activity-to-noise map corresponds to a closed configuration of the computing device having second acoustic properties, the closed configuration associated with a second hinge angle between the first portion and the second portion.

* * * * *